United States Patent [19]
Doering et al.

[11] Patent Number: 5,345,106
[45] Date of Patent: Sep. 6, 1994

[54] ELECTRONIC CIRCUIT COMPONENT WITH HEAT SINK MOUNTED ON A LEAD FRAME

[75] Inventors: Anton Doering, Pliezhausen; Ludger Olbrich, Reutlingen, both of Fed. Rep. of Germany

[73] Assignee: Robert Bosch GmbH, Stuttgart, Fed. Rep. of Germany

[21] Appl. No.: 11,215

[22] Filed: Jan. 29, 1993

Related U.S. Application Data

[60] Division of Ser. No. 930,474, Aug. 13, 1992, Pat. No. 5,202,288, which is a continuation of Ser. No. 709,654, Jun. 3, 1991.

[30] Foreign Application Priority Data

Jun. 1, 1990 [DE] Fed. Rep. of Germany ....... 4017697

[51] Int. Cl.⁵ .................... H01L 23/48; H01L 29/44; H01L 29/52; H01L 29/60
[52] U.S. Cl. .................... 257/675; 257/672; 257/706; 257/707; 257/796; 257/773; 257/666
[58] Field of Search ............... 257/666, 690, 692, 706, 257/707, 675, 672, 796, 773; 437/220

[56] References Cited

U.S. PATENT DOCUMENTS

| | | | |
|---|---|---|---|
| 3,651,448 | 3/1972 | Pauza | 357/70 |
| 3,657,611 | 4/1972 | Yoneda | 437/902 |
| 3,657,805 | 4/1972 | Johnson | 437/902 |
| 3,686,748 | 8/1972 | Engeler et al. | 438/211 |
| 3,698,075 | 10/1972 | Boyle | 437/220 |
| 3,922,775 | 12/1975 | Potter | 437/902 |
| 4,360,965 | 11/1982 | Fujiwara | 437/902 |
| 4,633,573 | 1/1987 | Scherer | 437/211 |
| 4,639,277 | 1/1987 | Hawkins | 437/902 |
| 4,722,914 | 2/1988 | Drye et al. | 437/982 |
| 4,864,384 | 9/1989 | Boudot et al. | 357/68 |
| 4,951,119 | 8/1990 | Yonemochi et al. | 437/220 |
| 4,975,761 | 12/1990 | Chu | 357/72 |
| 4,994,895 | 2/1991 | Matsuzaki et al. | 357/72 |
| 5,012,386 | 4/1991 | McShane et al. | 361/386 |
| 5,014,114 | 5/1991 | Heckaman et al. | 357/74 |
| 5,041,396 | 8/1991 | Valero | 437/209 |
| 5,045,503 | 9/1991 | Kobiki et al. | 437/902 |
| 5,099,310 | 3/1992 | Osada et al. | 357/81 |

FOREIGN PATENT DOCUMENTS

| | | | |
|---|---|---|---|
| 0067035 | 4/1983 | Japan | 437/209 |
| 0100447 | 6/1983 | Japan | 437/902 |
| 0120431 | 5/1988 | Japan | 437/209 |
| 0222450 | 9/1988 | Japan | 437/902 |
| 0270336 | 10/1989 | Japan | 437/902 |

OTHER PUBLICATIONS

Miroelectronics Packaging Handbook, Rao R. Tummala et al, pp. 523–553.

*Primary Examiner*—Jerome Jackson
*Assistant Examiner*—T. M. Arroyo
*Attorney, Agent, or Firm*—Frishauf, Holtz, Goodman & Woodward

[57] ABSTRACT

A standard lead frame has a carrier pierced to produce an opening sufficiently large to make room therein for the mounting of a semiconductor circuit chip. A heat sink for the semiconductor circuit chip is fastened into position in or just below the opening. The semiconductor circuit chip is then affixed directly to the heat sink. After wires have been bonded to connect contact areas of the chip to the conducting paths on the lead frame the unit is encapsulated in such a fashion that a major surface of the heat sink protrudes from the encapsulation. A standard lead frame may be used as the carrier.

4 Claims, 2 Drawing Sheets

ELECTRONIC CIRCUIT COMPONENT WITH HEAT SINK MOUNTED ON A LEAD FRAME

This is a division of application Ser. No. 07/930,474, now U.S. Pat. No. 5,202,288, filed Aug. 13, 1992, which is a file wrapper continuation of Ser. No. 07/709,654, filed Jun. 3, 1991.

This invention concerns an electronic circuit component and a method for producing the same, the electronic circuit component containing at least one semiconductor circuit chip which dissipates a considerable amount of heat and incorporates a heat conducting body in contact with the chip.

It has long been known to equip electronic power components with heat sinks in the form of heat conducting bodies for dissipating heat. These heat sinks are incorporated in most cases by inserting them into the casing mold mostly against the chip, as a result of which they come into heat conducting contact with the chip only through the mounting surfaces of the lead frames serving as the carrier. For surface-mountable components, it is also known to build the side of the casing that faces away from the circuit board as a heat sink and to attach cooling brackets to the circuit board. This construction can be accomplished only with correspondingly great utilization of space.

SUMMARY OF THE INVENTION

It is an object of the present invention to avoid the disadvantages of the known heat sink constructions in electronic circuit components which need to dissipate heat.

Briefly, an opening is pierced in a lead frame sufficient to surround the mounting surface of a chip. A heat conducting body is inserted in said opening or just below, but fitting in the lead frame, and then at least one chip is affixed in direct contact with the heat-conducting body.

After connections have been made by bonding wires to contact areas on the chip and to respective parts of the lead frame, the chip, its mounting and the surrounding area of the lead frame are encapsulated in a suitable conducting synthetic resin, but preferably a major surface of the heat conducting body protrudes outside of the encapsulation.

The invention has the advantage that a wide variety of electronic circuit components can be used in this way regardless of whether the components are to be surface-mounted or should be pressed into receiving openings in a circuit board and soldered fast to the rear side of the circuit board. It is particularly advantageous that standard lead frames can be used as carriers. By the insertion of a heat conducting body in the mounting surface of the lead frames and by the direct mounting of the chip on the heat conducting body a particularly good degree of heat dissipation is obtained.

Piercing of the lead frames for the openings required by the invention can be done by standard processes, such as stamping out, etching, and eroding out either with abrasive or electrode erosion. With the dimensioning of the heat conducting-body corresponding to the opening in the mounting surface of the lead frames it is possible to connect the heat conducting body with the lead frame serving as a carrier by standard methods such as squeezing, cold-welding, adhesive bonding or soldering. According to the nature of the surface material of the heat conducting body the chip can be mounted simply by adhesion in the case of a silver surface, by soldering in the case of a nickel surface, or by eutectic bonding in the case of a gold surface. Encapsulation of the chip can also be carried out advantageously by standard processes. In this regard molding plastic around them is particularly suitable. As already mentioned, the heat conducting body preferably protrudes from the encapsulation so-that direct heat coupling to a suitable cooling medium is possible.

The heat conducting body can advantageously be made by a block of a copper alloy or of aluminum, so that the thermal resistance from the chip to a cooling medium can be kept particularly small. Other measures provided by the invention for reducing the resistance to heat dissipation are the insertion of the heat conducting body in the mounting surfaces of the lead frames and the direct mounting of the chip on the heat conducting body. It is particularly advantageous that the heat can be conducted directly through the heat conducting body that serves as a heat sink and projects out of the encapsulation Of the chip to a suitable cooling medium. These advantages are particularly easy to obtain in surface-mountable power components carried on metal-core circuit boards, in which case the heat conducting bodies are put in direct contact with the metal core of the circuit board by suitable bonding processes with the circuit board, which then serves the function of a further cooling body.

BRIEF DESCRIPTION OF THE DRAWINGS

The invention is further described by way illustrative example with reference to the annexed drawings in which.

DESCRIPTION OF THE ILLUSTRATED EMBODIMENTS

Figure 1A:
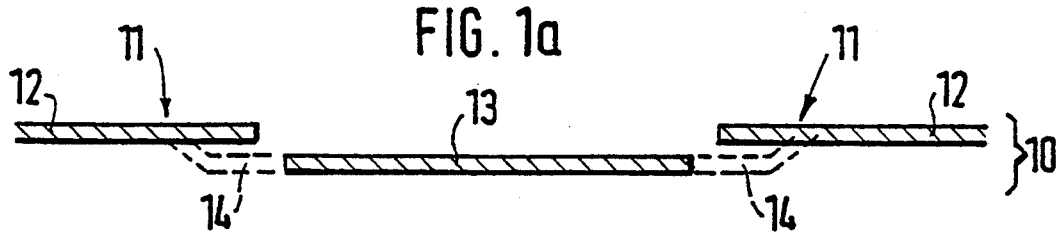
FIGS. 1a, 1b, 1c and 1d are median vertical cross-sections broken-off at left and right, illustrating several successive steps in the manufacture of an electronic circuit component in accordance with the invention.

FIG. 1a shows a carrier 10 which is provided by a single lead frame, .consisting of a frame 11, connection extensions 12, a mounting surface 13 and connecting strips 14 which provide a connection between the mounting surface 13 and the frame 11. A first process step can already be performed in the manufacture of the lead frames: piercing an aperture 20 shown pierced in FIG. 1b in the usual mounting surface 13. This can be done either by stamping out, etching out, or eroding out or some other suitable technology.

Figure 1B:
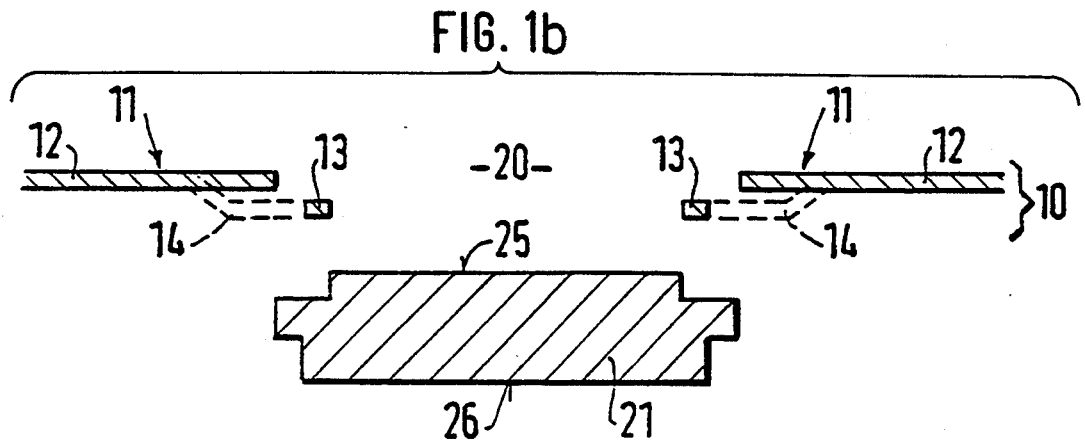

FIG. 1b shows the lead frame prepared as just mentioned and also a heat conducting body 21, of which the surface 25 is so dimensioned that it lines up accurately with the aperture 20. Only peripheral strips 13' remain in FIG. 1b from the mounting surface 13 shown in FIG. 1a. The heat conducting body 21 serving as a heat sink is made of a block of metal, as already mentioned, and its thickness is many times that of the thickness of the lead frame.

Materials suitable for the heat sink 21 are those of high heat conductivity as for example copper alloys or aluminum. Since a chip 30 is to be mounted on the surface 25 of the heat conducting body 21, it can be advantageous for the better adhesion of the chip to deposit a silver, nickel, or gold layer by vapor-deposition or sputtering on the surface 25 or even some other material selected for the corresponding mounting process.

Figure 1C:
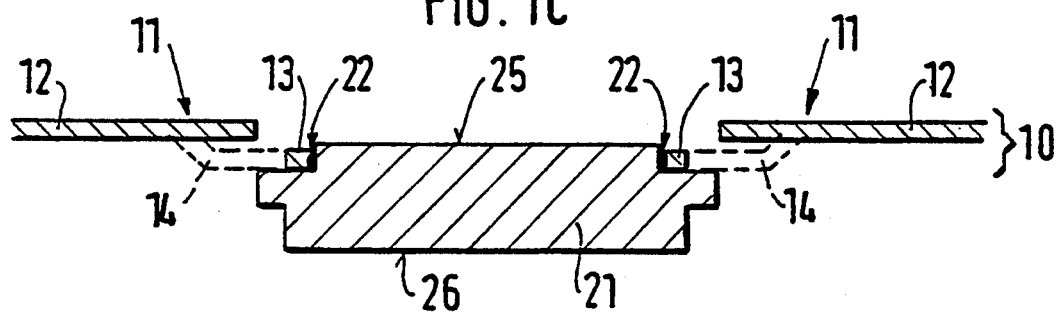

FIG. 1c shows the lead frame 10 after insertion of the heat conducting body 21 in the aperture 20. The connection of the heat conducting body 21 with the lead frame can be performed by squeezing, cold-welding, adhesive bonding or soldering at suitable locations 22. According to the nature of the surface 25 of the heat conducting body 21 the chip 30 can be affixed directly to the heat conducting body 21 by adhesion in case of a silver surface 25, by soldering in the case of a nickel surface 25 or by eutectic bonding in the case of a gold surface 25. The invention is not limited to these processes but extends to all suitable processes for mounting chips on heat sinks. The connections of the carriers of the chip 30 with connection paths on the surrounding portion of the lead frames can be produced by wire 32 bonded at both ends in the usual way.

Figure 1D:
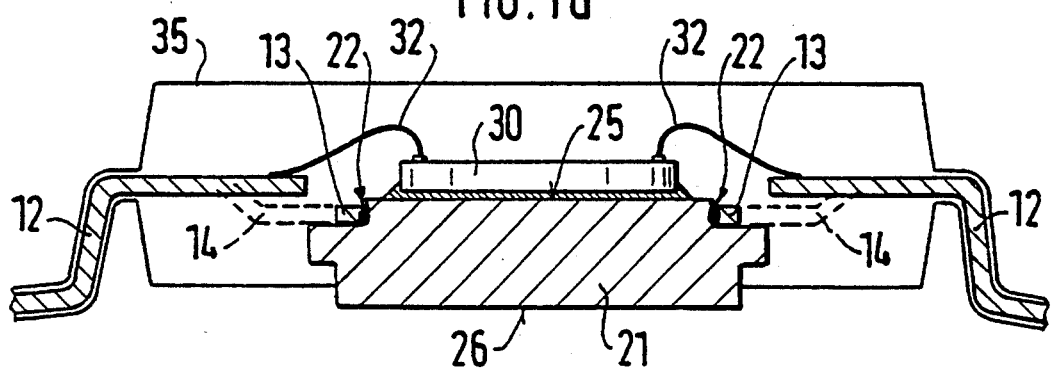

FIG. 1d illustrate& the construction after the chip 30, with its bonding wires 32 connected, has been so encapsulated in a mantle material 35 that one side 26 of the heat conducting body 21 extends out of the encapsulation 35. The surface 26 can now be brought directly into contact with a suitable cooling body through which the heat can be dissipated. That way the resistance to heat dissipation between the chip 30 and the cooling body can be kept particularly small. For certain applications air is also suitable as a cooling medium and no supplementary cooling body is necessary.

In the example illustrated in FIG. 1d the connection extensions 12 of the lead frames are bent in a manner characteristic for a surface-mounted component. The component of the invention is particularly suitable for such surface-mounted electronic components for mounting on metal core circuit boards, in which case the heat sink 21 can, by a suitable process, be brought into contact with the metal core of the circuit board (not shown) that serves as a further cooling body. This represents a particularly space-saving solution of the problem of dissipation of heat from power, components mounted on circuit boards. The process illustrated in FIGS. 1a to 1d is also suited for components which are pressed through apertures in a circuit board (not shown) and are then soldered fast to the rear side of the circuit board.

Figure 2:
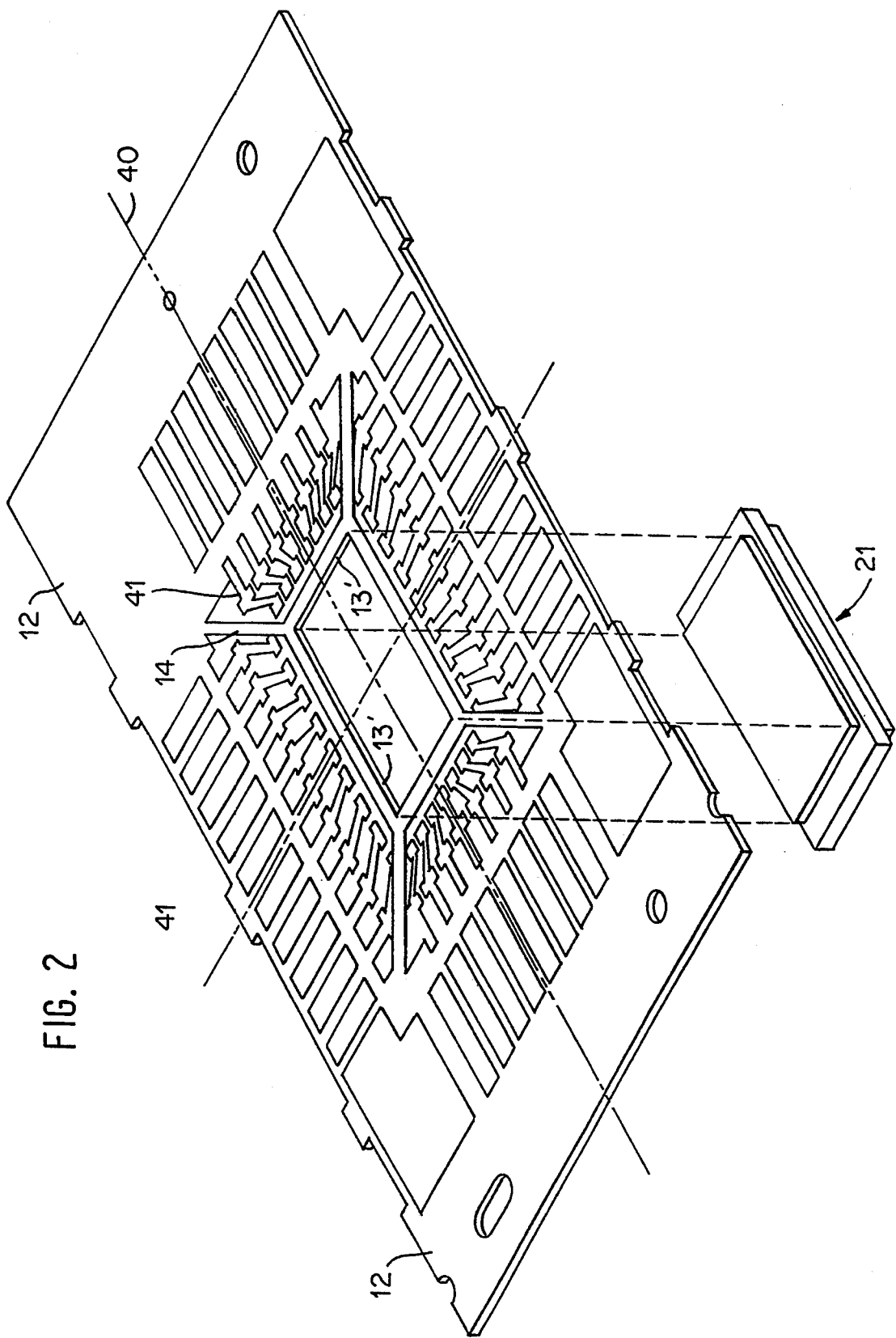
FIG. 2 is a perspective view of the lead frame in condition shown in FIG. 1b prior to the fastening in the heat conducting body.

FIG. 2 shows a standard lead frame as it is stamped out, in a perspective view provided by an isometric drawing, also showing the heat conducting carrier body 21 immediately below the aperture in the lead frame into which it will fit. The strips 14 are bent by a forming operation so that the strips 13' take the positions shown in FIGS. 1a, 1b, 1c, and 1d.

FIGS. 1a, 1b, 1c and 1d are cross sections along the center line 40 of FIG. 2, also after the forming operation has been performed on the strips 14.

In the case of FIG. 1d the extension 12 of the lead frame have been bent for the purposes described in connection with the description of FIG. 1d. Air cooling or heat conduction can be provided below the body 21 and conduction of heat through the center of the lead frame is minimized. The lead frame shown in FIG. 2 has a large number of tongues 41 which cannot be distinguished from the rest of the lead frame in FIGS. 1a, 1b, 1c, and 1d. For the connections to a chip 30, as shown in FIG. 1d, bonding wires 32 are used for connecting the chip 30 to these tongues.

Although the invention has been described with reference to a particular illustrative example, it will be recognized that variations and modificatins are possible within the inventive concept.

We claim:

1. An electronic circuit component comprising:

a lead frame (11) of sheet metal having a planar top portion and having, integral therewith, a flat mounting plate (13) which has an aperture (20) therein, said aperture being of a contour similar to that of said mounting plate and being of a size such that said mounting plate forms a peripheral planar strip frame (13') surrounding said aperture, said strip frame being supported in said lead frame by sheet metal strips (14) of said sheet metal of said lead frame, said sheet metal strips (14) integrally joining said strip frame to said lead frame such that said strip frame defines a plane parallel to said planar top portion of said lead frame, a heat conducting body (21), seated in said aperture and having a top surface (25) parallel to said plane of said strip frame and parallel to said planar top portion of said lead frame;

said lead frame having lead connecting portions (41) extending along said top portion thereof, said lead connecting portions terminating adjacent to said strip frame;

said sheet metal strips (14) being integrally joined to locations of said lead frame which do not have said lead connecting portions thereon (41); and at least one semiconductor chip (30) affixed to the top surface of said heat conducting body (21) for positioning said at least one semiconductor chip relative to said lead frame, and for passage of heat from said at least one semiconductor chip to said heat conducting body;

said at least one semiconductor chip being connected to said lead connecting portions by bonding wires (32) having respective ends bonded to respective lead connecting portions of said lead frame; and said at least one semiconductor chip, said bonding wires, a portion of said lead connecting portions of said lead frame and a portion of said heat conducting body being embedded in and encapsulated by molded electrically non-conducting material.

2. The electronic circuit component of claim 1, wherein said heat-conducting body is composed of a substance selected from the group consisting of copper alloys and aluminum.

3. The electronic circuit component of claim 1, wherein said heat conducting body has an exposed major surface (26) which protrudes outside of said molded non-conductive material.

4. The electronic circuit component of claim 1, wherein:

said lead connecting portions of said lead frame are elongated connecting members which have respective ends adjacent said strip frame, and which extend in a direction away from said strip frame, said bonding wires being respectively bonded to said elongated connecting members and, said elongated connecting members having outer extremities (12) which are bent and which extended at substantially right angles to and in the same direction away from said planar top portion of said lead frame, for spacing said strip frame from a supporting circuit plate and for maintaining said strip frame parallel to said supporting circuit plate, said elongated connecting members having respective end portions remote from said planar top portion of said lead frame which are directed parallel to said strip frame for surface mounting on said supporting circuit plate; and an exposed surface of said heat conducting body is substantially flush with said end portions of said elongated connecting members which are provided for surface mounting on said supporting circuit plate.

* * * * *